United States Patent [19]
Wadley et al.

[11] Patent Number: 5,825,401
[45] Date of Patent: Oct. 20, 1998

[54] SLIDE IN FORMATTER FOR IMAGE FORMING DEVICES

[75] Inventors: Don K. Wadley, Boise; John W. Huffman, Meridian; Paul K. Mui, Boise, all of Id.

[73] Assignee: Hewlett-Packard Company, Palo Alto, Calif.

[21] Appl. No.: 802,179

[22] Filed: Feb. 13, 1997

Related U.S. Application Data

[63] Continuation of Ser. No. 239,655, May 9, 1994, abandoned.

[51] Int. Cl.⁶ .......................................... B41J 2/47
[52] U.S. Cl. ............................................. 347/247; 347/263
[58] Field of Search ...................... 347/247, 237, 347/263, 245, 138, 152, 170; 361/686, 727, 736, 737, 740, 741

[56] References Cited

U.S. PATENT DOCUMENTS

| | | | |
|---|---|---|---|
| 5,313,699 | 5/1994 | Freige et al. | 361/736 |
| 5,452,405 | 9/1995 | Vondran, Jr. | 395/114 |

*Primary Examiner*—Mark J. Reinhart

[57] ABSTRACT

Disclosed is a slide-in formatter which can be installed in an image forming device such as a laser printer or a fax machine. The image forming device is fitted with a card cage on an interior side of the device housing. A formatter receiving slot is formed in the housing, adjacent to the card cage, extending from the exterior of the housing to its interior. The card cage includes a pair of opposing receiving rails positioned to receive and hold the side edges of formatter board. Suitable mating electrical connectors are attached to both the slide-in formatter board and the card cage which will complete an electrical connection between the slide-in formatter and the internal components of the image forming device.

7 Claims, 8 Drawing Sheets

SLIDE IN FORMATTER FOR IMAGE FORMING DEVICES

CROSS REFERENCE TO RELATED APPLICATION

This is a continuation of application Ser. No. 08/239,655 filed on May 9, 1994, now abandoned.

BACKGROUND OF THE INVENTION

1. Technical Field

This invention generally relates to format controllers for image forming devices, such as laser printers. More particularly, this invention relates to a slide-in formatter which can easily be replaced or modified in the field, even by an end user.

2. Background Art

This invention is primarily concerned with image forming devices having print engines which are controlled by a printer controller. This general category includes such devices as facsimile machines and computer printers. This category also includes what are known as "laser" print engines and "LED" print engines, which use light emitting diodes to expose the photoconductor rather than a laser or laser diode. The printer control circuit, commonly called a "formatter," controls the operation of the print engine. The print engine, which in a laser or LED image forming device, consists of a photoconductor, a laser or other light emitter for exposing the photoconductor, a toner reservoir, a developer and a fuser mechanism, fixes an image to the print media, where the image represents textual and/or graphic data.

The formatter can control such things as the scan rate of the light source, the frequency at which the light source is modulated, also known as the data or video rate, the velocity at which the print media passes through the print engine, the order of the data which is registered on the photoconductor. The formatter thus controls which data, and how that data, will be registered on the photoconductor. This allows the formatter to determine such things as the final print resolution, particular fonts and even a specific order that the pages of data will be printed. These capabilities allow for features such as adjustable and user selectable print resolutions, font selection and duplex printing for these image forming devices.

Prior to the present invention, there has been no convenient way for a service technician, let alone an end user, to select, upgrade or otherwise modify the formatter of a particular image forming apparatus. One of the more common upgrades implemented is to increase the amount of random access memory (RAM) available to the formatter. This upgrade increases both the speed and overall performance of the device. Because this is a common desire, manufacturers have designed and included access panels in the housings of the image forming devices to enable technicians and users to have access to memory expansion slots to add memory chips and modules. Additionally, manufacturers have provided a separate accessory slot for accepting a modular input/output interface card, which allows a technician or end user to install special function cards, such as fax cards, network cards, etc., to add flexibility to the image forming device. Similarly, several manufacturers provide separate font cartridge slots which allow a technician or end user to install font cards, usually a read only memory (ROM) cartridge, giving the image forming device more font capabilities.

As these devices become more flexible and more features are added, more individual methods of access are necessary to both the technician and the end user to take advantage of the features, resulting in more access slots and panels in the device housing. This obviously increases the complexity of the design of the device and the costs of manufacturing and assembly, which is especially true where certain components of the device are manufactured by another party and then incorporated into the finished product.

What is needed is a single, convenient method of upgrading and servicing the formatter of an image forming device which reduces the complexity of the device's design and the costs associated with manufacturing and assembling the device.

It is therefore an object of the present invention to provide a single, user serviceable component which allows the user to upgrade the memory of the image forming device, add or change accessory devices such as network cards, fax cards and the like, and even completely replace the formatter without major disassembly of the image forming device.

DISCLOSURE OF THE INVENTION

This object, and others, are accomplished by a slide-in formatter which can be installed in an image forming device such as a laser printer or a fax machine. The image forming device is fitted with a card cage on an interior side of the device housing. A formatter receiving slot is formed in the housing, adjacent to the card cage, extending from the exterior of housing to its interior. The card cage includes a pair of opposing receiving rails positioned to receive and hold the side edges of a formatter board, i.e., the slide-in formatter. Suitable mating electrical connectors are attached to both the slide-in formatter and the card cage which will complete an electrical connection between the slide-in formatter and the internal components of the image forming device.

A face plate bracket extends upwardly from the front edge of the card cage and includes a removable retaining means for providing a mechanical connection between the face plate and the card cage. This way, the face plate is mechanically attached to the front edge of the slide-in formatter. Memory sockets are provided on the slide-in formatter and electrically connected to the formatter circuit through the formatter printed circuit board. Both a serial connector and a parallel connector are provided on the slide-in formatter which allow the image forming device to communicate with other electronic devices.

The slide-in formatter will also accept a modular input/output (MIO) unit. This is accomplished by a similar electrical connector which is attached to the slide-in formatter and the MIO unit. A pair of opposing MIO board receiving rails are attached to the formatter board in parallel spaced relation along opposing ends of an MIO receiving slot formed in the face plate. A separate MIO cover is removably attached over the MIO receiving slot using a suitable attachment means. This allows an MIO unit to be installed and removed without having to remove the slide-in formatter. A hard disk, or other non-volatile storage device can be attached to the slide-in formatter for storing font data or other operational software.

DETAILED DESCRIPTION OF THE INVENTION

Figure 1:
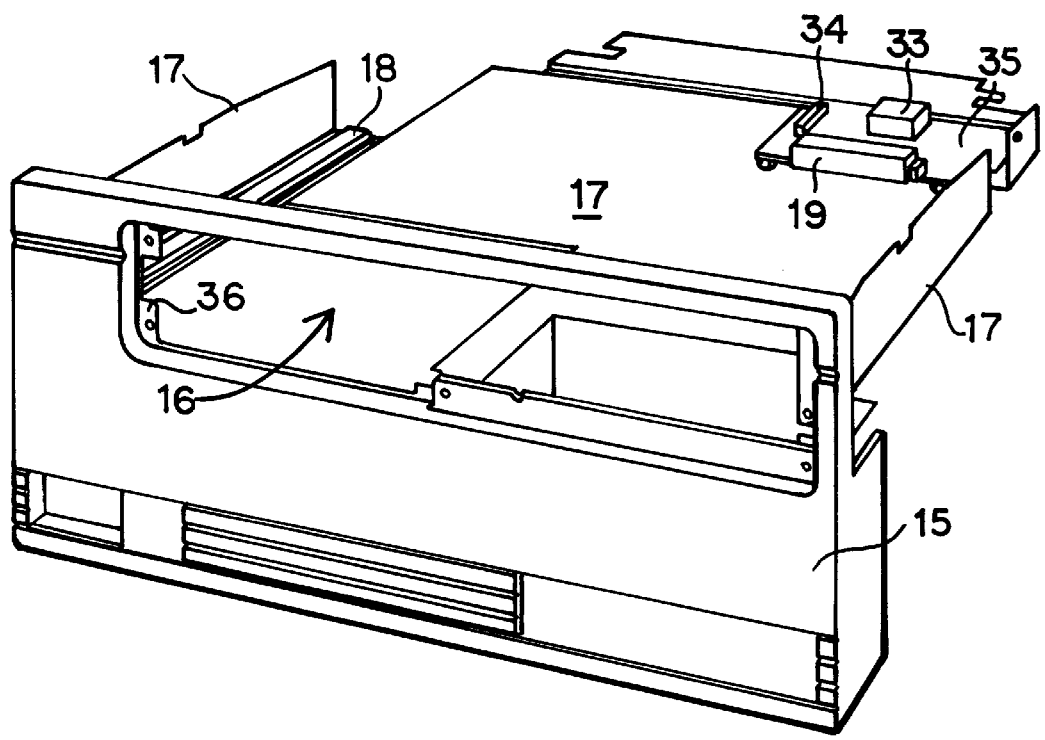
FIG. 1 is an isometric view of the back of a typical laser printer having a card cage installed therein for receiving a slide-in formatter.
Figure 2:
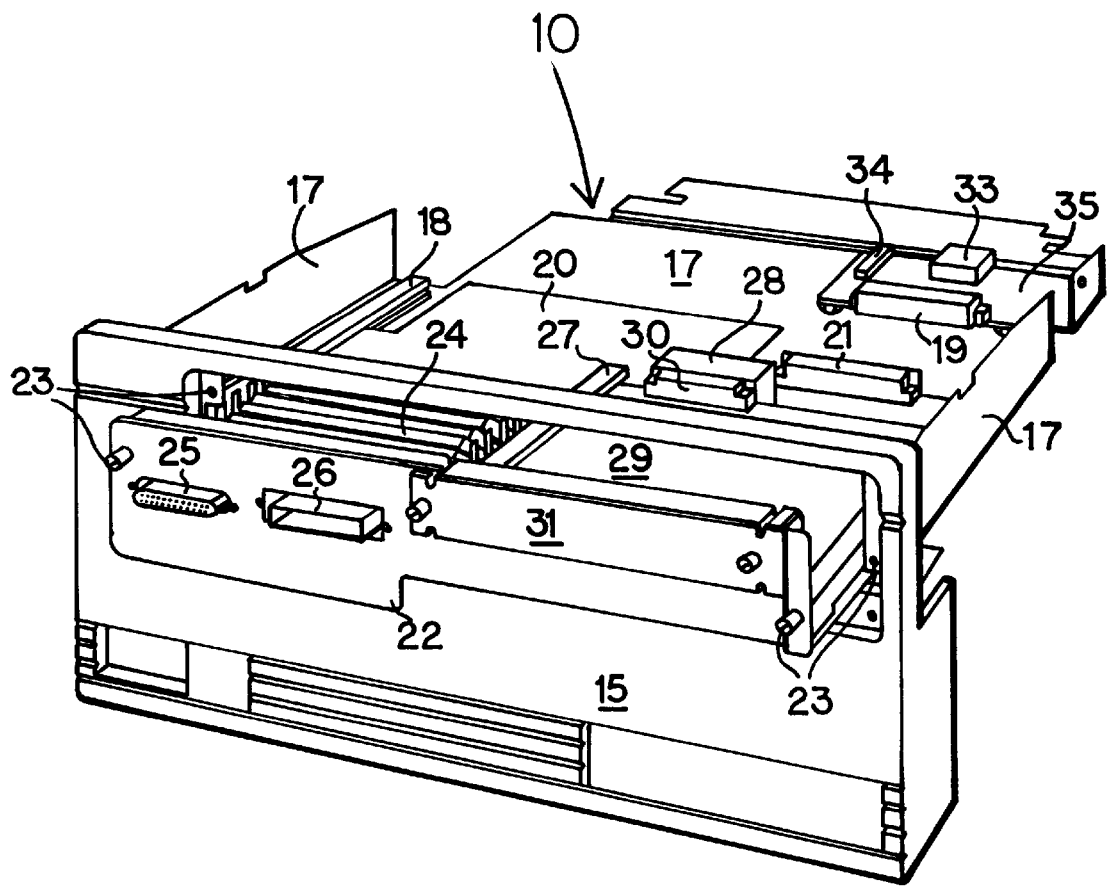
FIG. 2 is an isometric view of the back of the laser printer having a slide-in formatter partially inserted in the card cage.
Figure 3:
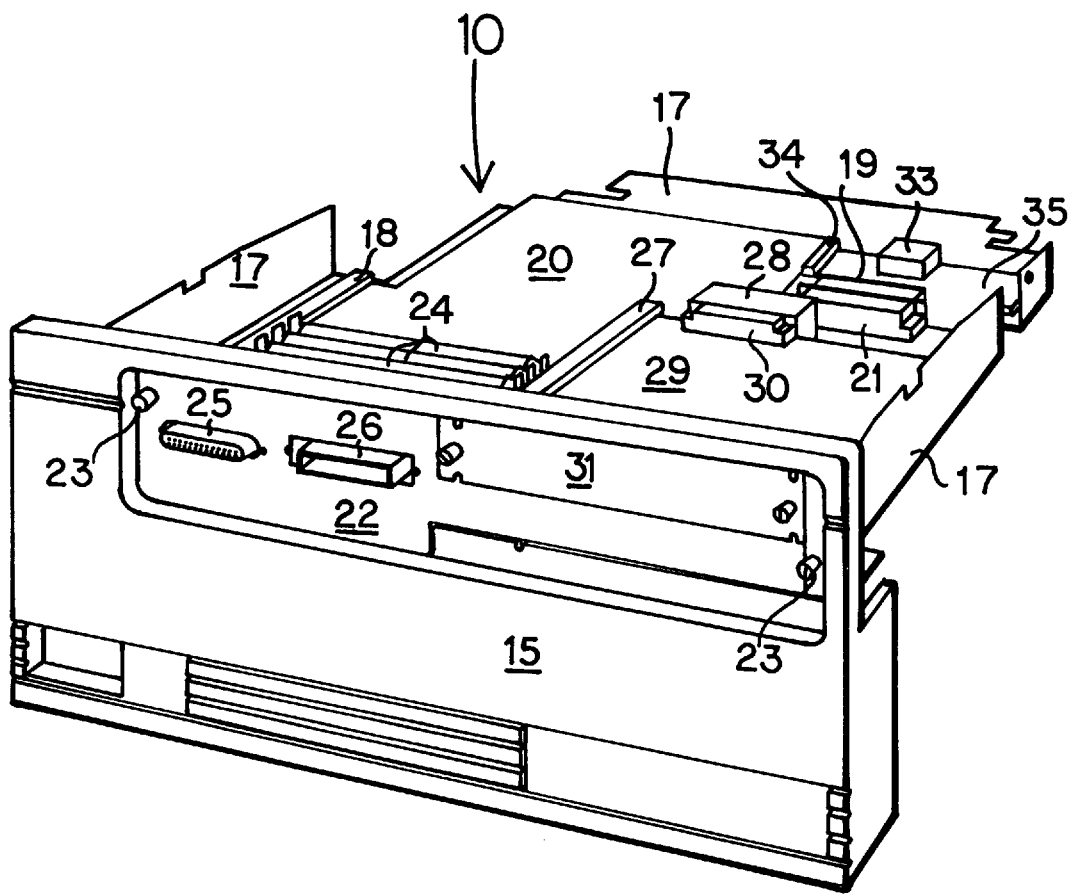
FIG. 3 is an isometric view of the back of the laser printer having the slide-in formatter fully inserted and installed in the card cage.
Figure 4:
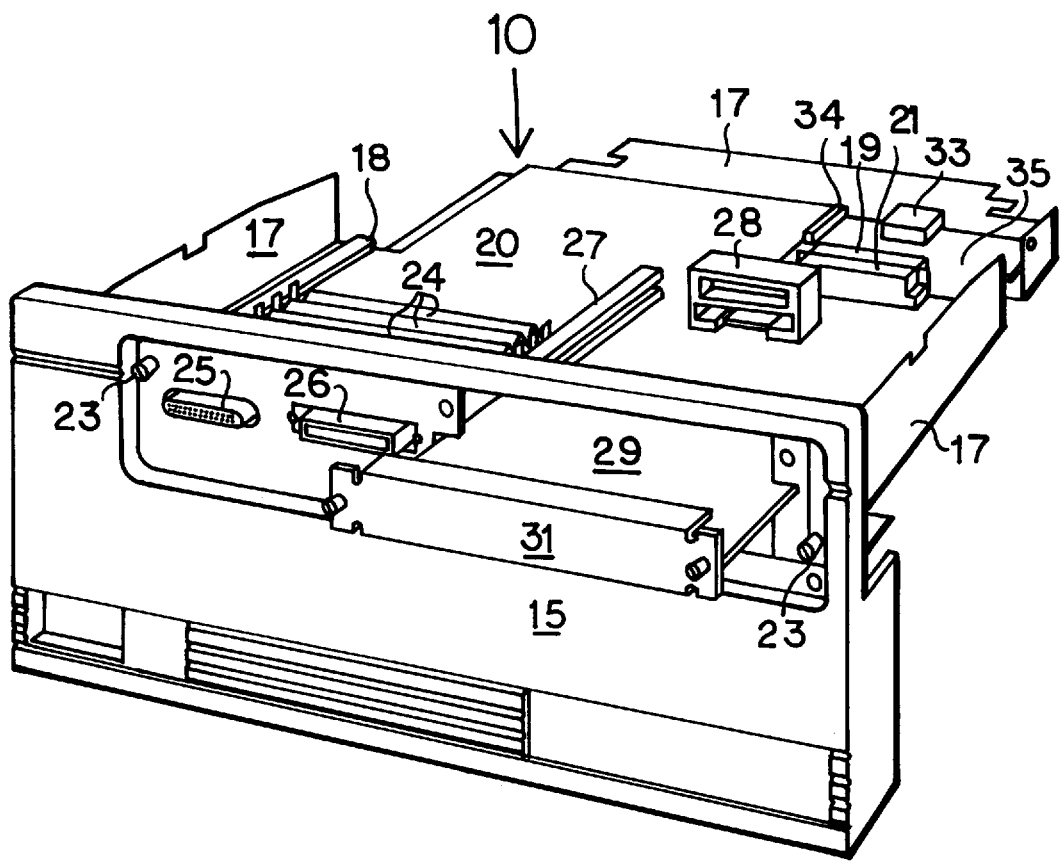
FIG. 4 is an isometric view of the back of the laser printer having the slide-in formatter installed and a Modular Input/Output unit partially installed therein.
Figure 5:
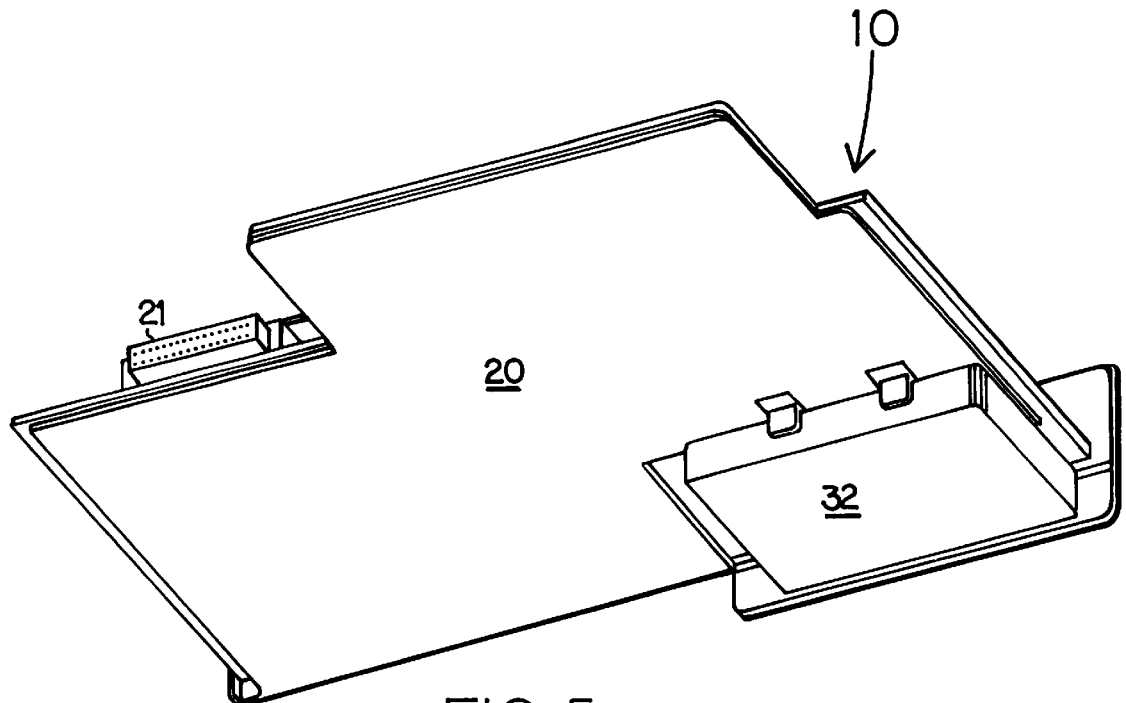
FIG. 5 is a front isometric view of the bottom of the slide-in formatter.
Figure 6:
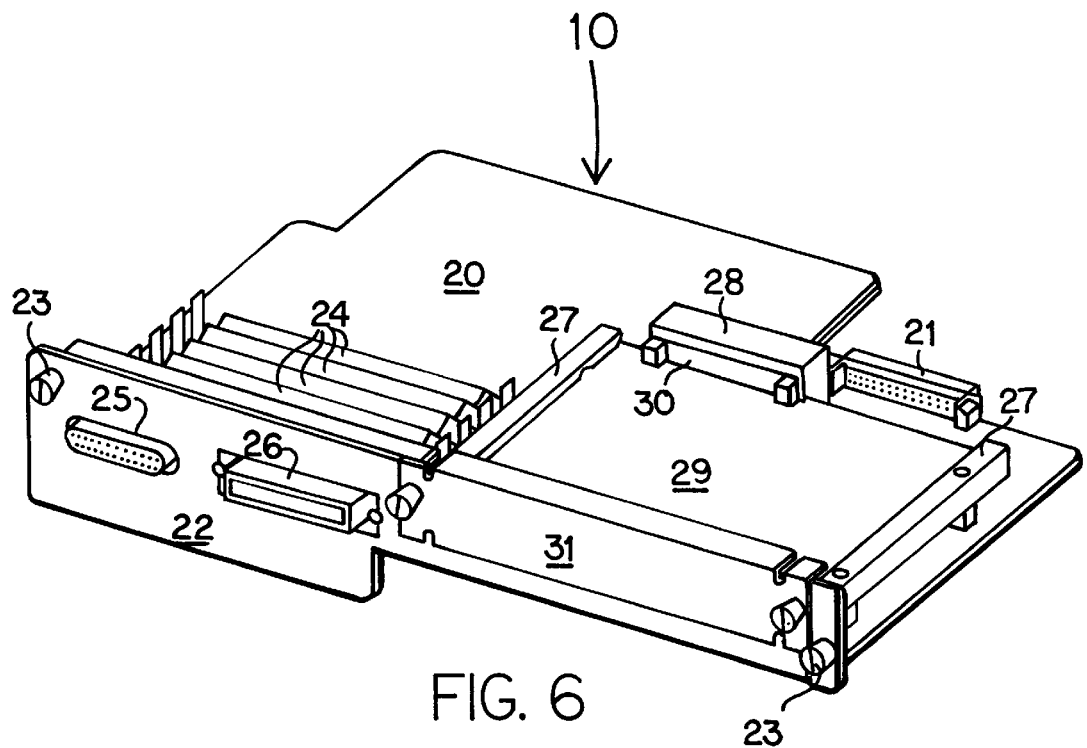
FIG. 6 is a rear isometric view of the top of the slide-in formatter.
Figure 7:
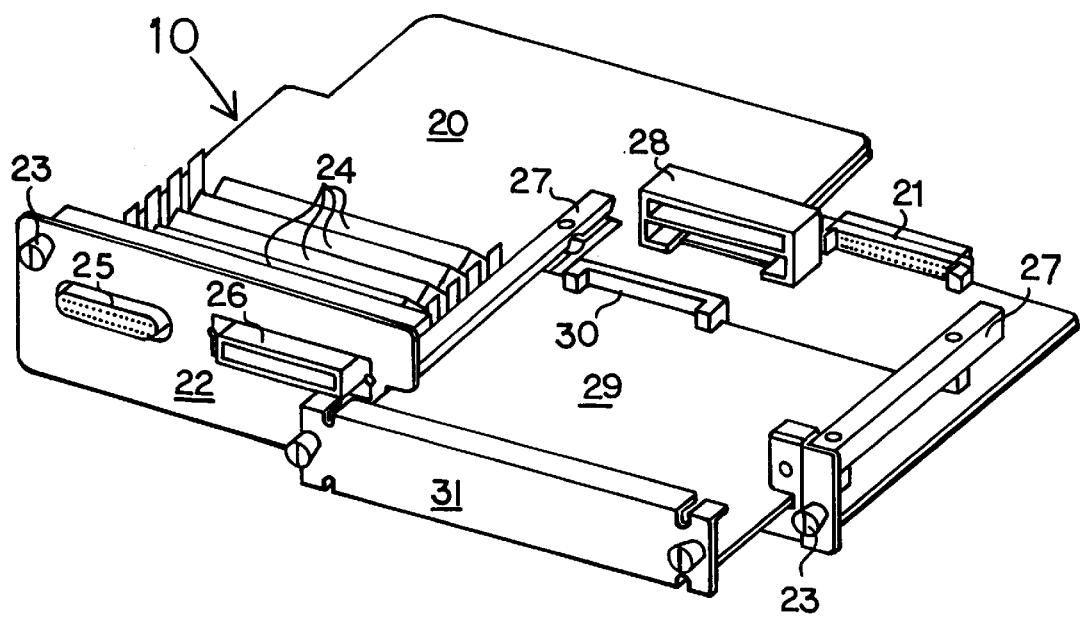
FIG. 7 is a top rear isometric view of a slide in formatter having a modular input/output unit installed therein.
Figure 8:
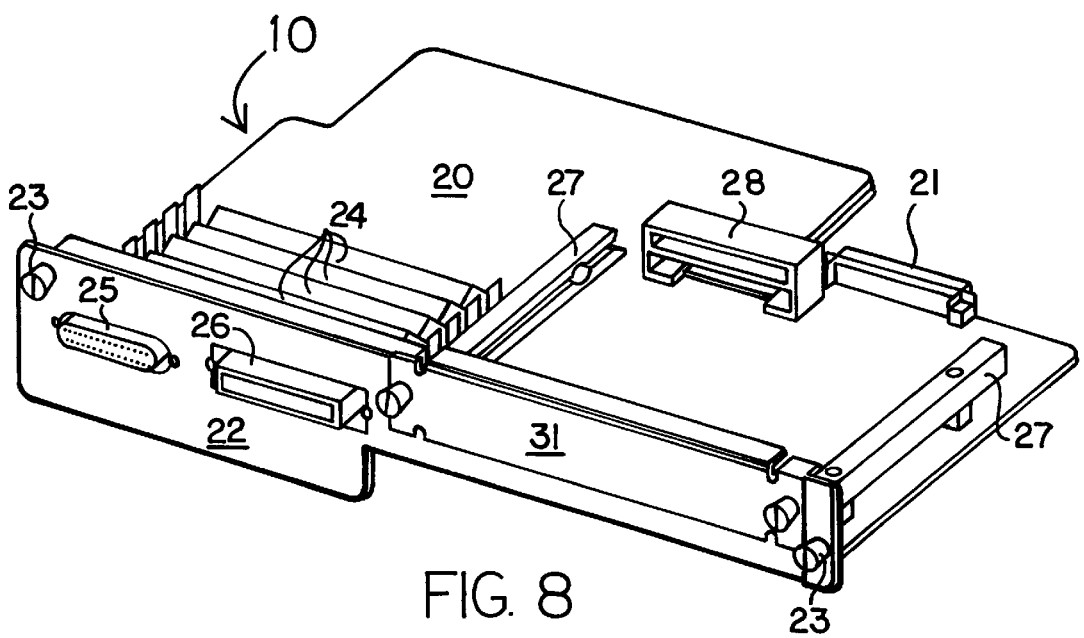
FIG. 8 is a top rear view isometric view of a slide in formatter with no modular input/output unit installed, and a cover plate over the access port.
Figure 9:
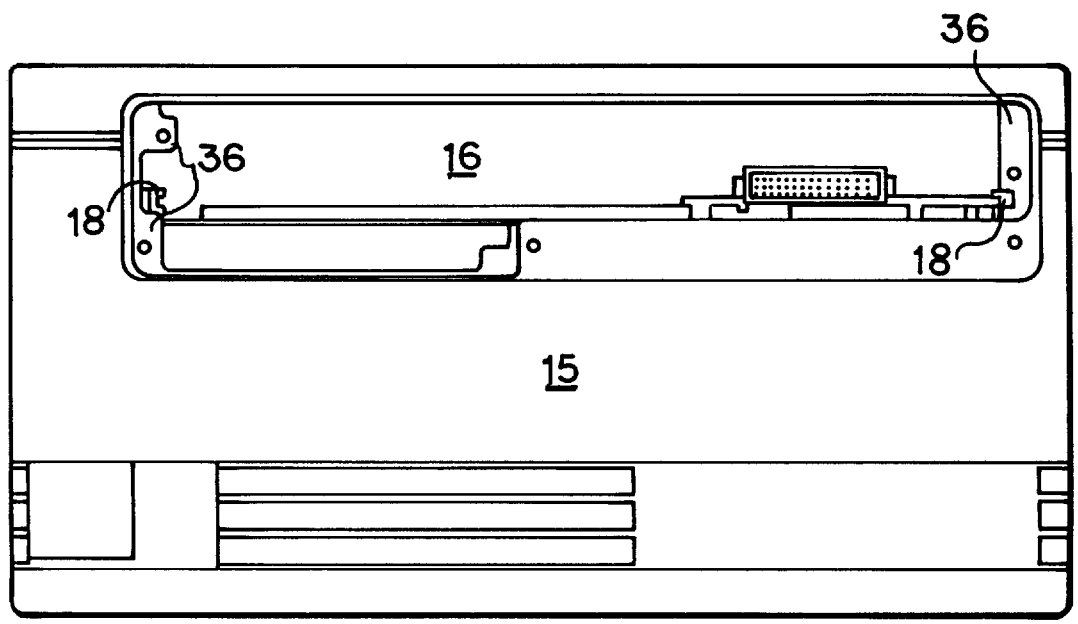
FIG. 9 is a back view of the laser printer having the slide-in formatter installed therein.
Figure 10:
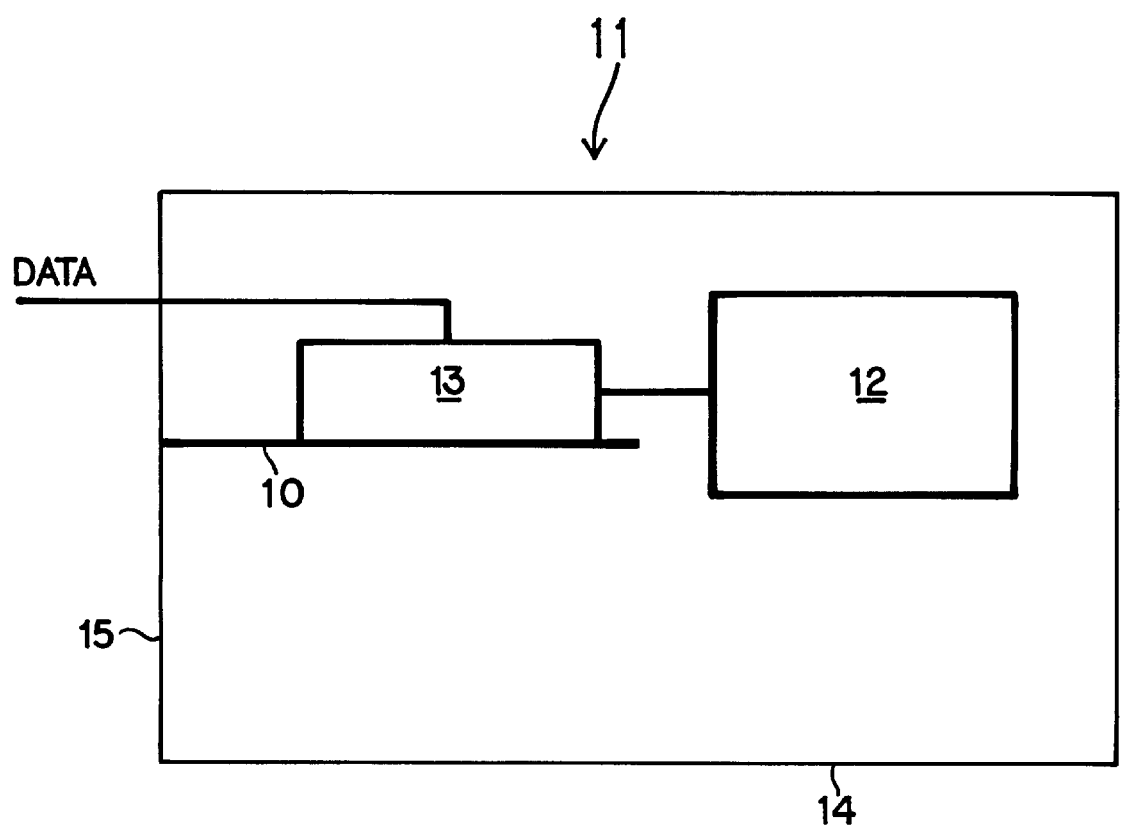
FIG. 10 is a simplified block diagram of an image forming apparatus.

Referring now to the figures, a slide-in formatter is illustrated in detail, being generally designated as 10, and is shown installed in a laser printer, here generally referred to as image forming device 11. Image forming device 11 includes a print engine 12 positioned within housing 14. Print engine 12 here consists of a photoconductor for retaining a latent image, a laser or other light emitter for exposing the photoconductor to create the latent image, a toner reservoir and developer for applying toner to the latent image and a fuser mechanism for fixing the image to the print media. However, this invention is equally applicable to other types of print engines, e.g., impact print mechanisms, thermal paper and wax mechanisms, ink-jet print mechanisms, etc., which employ a formatter to control the printing process. Additionally, this invention is also applicable to systems printing in color, as well as those printing only in monochrome.

Image forming device 11 has a card cage 17 attached to the interior side of the back frame member 15, which itself forms part of housing 14. A formatter receiving slot 16 is formed in back frame member 15. Formatter receiving slot 16 extends from the exterior of housing 14 to its interior. Card cage 17 is disposed around the bottom and opposing ends of slot 16. However, it should be noted that other configurations for card cage 17 could work, including a single plate attached to either the top or bottom edges of receiving slot 16 or a pair of plates attached at the opposing ends of receiving slot 16. Card cage 17 includes a pair of opposing receiving rails 18 mounted thereon and positioned to receive and hold the side edges of formatter board 20.

A suitable electrical connector 19, here the female side of a multiple pin connector, such as a AMP 650478-5, is attached to an interfacing PCB 35, which is mechanically attached to card cage 17. Electrical connector 19 is positioned to align and mate with an electrical connector on slide-in formatter 10, here a male multiple pin connector 21, as is explained later. Separate electrical connectors, shown at 33 and 34, are attached to interfacing printed circuit board (PCB) 35 for connecting slide-in formatter 10 to print engine 12 and supplying power to auxiliary devices such as a modular input/output unit 29 and a non-volatile storage device, such as hard disk 32, both of which will be explained later. It should be noted that while the preferred embodiment makes use of pin type connectors, other connectors will work, such as the standard card edge connectors employed in personal computer expansion cards.

A face plate bracket 36 extends upwardly from the front edge of card cage 17 and includes a removable retaining means 23 for providing a mechanical connection between face plate 22 and card cage 17. Retaining means 23 here includes keeper thumb screws which thread into threaded holes in face plate bracket 36, retaining face plate 22 therebetween. It should be noted that other types of retainers could be employed such as cam locks, bayonet or breach type locking devices, resilient finger type latches, etc. In any case, face plate 22 is mechanically attached to the front edge of formatter board 20. Formatter board 20, to which formatter circuit 13 is attached, is here a printed circuit board (PCB) which actually forms part of formatter circuit 13. Memory sockets 24 are also attached to formatter board 20 and electrically connected to formatter circuit 13 through formatter board 20. Memory sockets 20 can be single in-line memory module (SIMM) sockets, single in-line package (SIP) sockets, dual in-line package (DIP) sockets, or any other memory package receivers. Both a serial connector 25 and a parallel connector 26 are attached through face plate 22 to formatter board 20, at its front edge. Serial connector 25 and parallel connector 26 provide standardized electrical connectors to electrically interface image forming device 11 with other stand alone devices, such as a personal computer.

As mentioned earlier, electrical connector 21 is attached to formatter board 20 at its back edge and positioned to mate with connector 19 on card cage 17. Here, electrical connector 21 is a male multiple pin connector, such as a AMP 650868-4. Connectors 19 and 21 are positioned and configured to engage and disengage upon insertion and removal of slide-in formatter 10. An additional high rise electrical connector, here designated as MIO female connector 28, is attached to formatter board 20 and positioned to mate with MIO male connector 30. MIO male connector 30 is attached to the back edge of an optional MIO board, which when slid into place, will engage MIO connector 28. Opposing MIO board receiving rails are attached to formatter board 20 in parallel spaced relation along opposing ends of MIO receiving slot 37 in face plate 22. A separate MIO cover 31 is removably attached over MIO receiving slot 37 using a suitable attachment means such as keeper thumb screws or the like. With this configuration, MIO board 29 can be installed and removed without having to remove slide-in formatter 10. Hard disk 32 is here attached to the underside of formatter board 20 and electrically connected to formatter circuit 13 through formatter board 20.

Card cage 17 and slide-in formatter 10 are installed within image forming device 11 during manufacture. Memory upgrades can now be easily accomplished by removing the keeper screws of removable retaining means 23, sliding slide-in formatter 10 partially out of receiving slot 16, inserting memory modules into memory sockets 24, sliding slide-in formatter back into receiving slot 16 and replacing the keeper screws. Similarly, slide-in formatter 10 can be completely replaced or removed and reinstalled after service. MIO boards 29 can similarly be installed, removed and serviced.

While there is shown and described the present preferred embodiment of the invention, it is to be distinctly understood that this invention is not limited thereto but may be variously embodied to practice within the scope of the following claims.

What is claimed is:

1. An image forming device for printing an image on a page of print media which comprises:

a housing having a formatter board receiving slot therein extending from the exterior of the housing to the interior of the housing;

a print engine, for affixing an image representing data to the page of print media, being positioned within the housing;

a slide-in formatter board being slidably received within the formatter board receiving slot;

a removable retainer for holding the slide-in formatter board in the formatter receiving slot;

a formatter for supplying data to the print engine, the formatter being positioned on the slide-in formatter board; and an electrical connector being connected between the formatter and the print engine for transferring electrical signals therebetween.

2. The image forming device of claim 1 further comprising:

a card cage being attached to an interior side of the housing; and at least one receiving rail being attached to the card cage and positioned to receive an edge of the formatter board.

3. The image forming device of claim 2 further comprising a second receiving rail, the two rails arranged to define a pair of receiving rails attached to the card cage in opposing parallel spaced relation, each of the rails having a formatter board receiving slot therein positioned to slidably receive and guide the formatter board.

4. The image forming device of claim 3 wherein the slide-in formatter board includes means for slidably receiving a modular input/output unit and means for electrically connecting a modular input/output unit to the formatter board.

5. The image forming device of claim 2 wherein the slide-in formatter board includes means for slidably receiving a modular input/output unit and means for electrically connecting a modular input/output unit to the formatter board.

6. The image forming device of claim 1 wherein the slide-in formatter board includes means for slidably receiving a modular input/output unit and means for electrically connecting a modular input/output unit to the formatter board.

7. A printer having a print engine responsive to a formatter circuit comprising:

a housing having a formatter board receiving slot therein extending from the exterior of the housing to the interior of the housing;

a printed circuit board being slidably receivable within the formatter board receiving slot;

a removable retainer for holding the printed circuit board in the formatter receiving slot when it is inserted therein;

a formatter circuit for supplying data to the print engine, the formatter circuit being attached to the printed circuit board; and an electrical connector connectable between the formatter circuit and the print engine for transferring electrical signals therebetween.

* * * * *